(12) United States Patent
Hazan et al.

(10) Patent No.: US 11,648,579 B2
(45) Date of Patent: May 16, 2023

(54) METHOD AND SYSTEM FOR GENERATING A ROBOTIC PROGRAM FOR INDUSTRIAL COATING

(71) Applicant: SIEMENS INDUSTRY SOFTWARE LTD., Tel Aviv (IL)

(72) Inventors: Moshe Hazan, Elad (IL); Meir Koren, Beer Sheva (IL); Rafael Blumenfeld, Raanana (IL); Ada Raveh, Motza Illit (IL)

(73) Assignee: Siemens Industry Software Ltd, Tel Aviv (IL)

( * ) Notice: Subject to any disclaimer, the term of this patent is extended or adjusted under 35 U.S.C. 154(b) by 510 days.

(21) Appl. No.: 16/903,610

(22) Filed: Jun. 17, 2020

(65) Prior Publication Data

US 2020/0391241 A1   Dec. 17, 2020

(30) Foreign Application Priority Data

Jun. 17, 2019   (EP) ..................................... 19180630

(51) Int. Cl.
  *B05B 15/70*   (2018.01)
  *B05B 12/08*   (2006.01)
  *G06F 30/27*   (2020.01)

(52) U.S. Cl.
  CPC ............ *B05B 15/70* (2018.02); *B05B 12/084* (2013.01); *G06F 30/27* (2020.01)

(58) Field of Classification Search
  CPC ....... B05B 15/70; B05B 12/084; G06F 30/27; G05B 2219/36252; G05B 2219/45013; B25J 9/1671; B25J 9/1664; B25J 9/1676; B25J 9/1666; B25J 9/1679; B25J 11/0075; G06N 20/00
  See application file for complete search history.

(56) References Cited

U.S. PATENT DOCUMENTS

| | | | |
|---|---|---|---|
| 9,811,074 B1 | 11/2017 | Aichele et al. | |
| 10,969,217 B2 * | 4/2021 | Bourne | B05B 12/004 |
| 2017/0032060 A1 | 2/2017 | Dror et al. | |
| 2017/0036232 A1 * | 2/2017 | Hoffman | B05B 13/0431 |

FOREIGN PATENT DOCUMENTS

| | | | | | |
|---|---|---|---|---|---|
| CN | 101791801 B | * | 6/2012 | | |
| CN | 104520076 A | * | 4/2015 | ............ | B25J 9/1671 |
| CN | 107804449 A | * | 3/2018 | ............... | B64C 1/00 |
| JP | 2004243215 A | * | 9/2004 | | |
| JP | 2012149342 A | * | 8/2012 | ............. | F01D 5/288 |

* cited by examiner

*Primary Examiner* — Kandasamy Thangavelu
(74) *Attorney, Agent, or Firm* — Laurence A. Greenberg; Werner H. Stemer; Ralph E. Locher

(57) ABSTRACT

Systems and a method predict a generation of a robotic program for industrial coating. Inputs are received including a virtual representation of a robot, a coating gun, elements of the object surface to be coated and a set of desired coating thickness ranges. Inputs on a coating dispersion object are also received. Training data of a plurality of robotic programs for industrial coating and of their corresponding coating thickness coverage on a plurality of surfaces are received. The training data are processed in x, y tuples so as to learn a mapping function to generate a coating prediction module. Starting with a given selected valid thickness coverage as input parameters, it is proceeded in an iterative manner to predict a robotic program via the coating prediction module. A coating robotic program is generated for each surface element based on the resulting predicted coating programs.

9 Claims, 9 Drawing Sheets

- 902 RECEIVING INPUTS INCLUDING VIRTUAL REPRESENTATION OF A ROBOT, VIRTUAL REPRESENTATION OF A ROBOTIC COATING GUN, VIRTUAL REPRESENTATION OF A SET OF ELEMENTS OF THE OBJECT SURFACE TO BE COATED AND A SET OF DESIRED COATING THICKNESS RANGES, VIRTUAL REPRESENTATION OF AN INDUSTRIAL SUB-CELL

- 904 RECEIVING INPUTS ON A COATING DISPERSION OBJECT TO BE MOUNTED ON THE COATING GUN FOR EMULATING COATING BEHAVIOR OF THE COATING GUN

- 906 RECEIVING TRAINING DATA OF A PLURALITY OF ROBOTIC PROGRAMS FOR INDUSTRIAL COATING AND THEIR CORRESPONDING COATING THICKNESS COVERAGE ON A PLURALITY OF SURFACES

- 908 PROCESSING THE TRAINING DATA FOR MACHINE LEARNING PURPOSES TO OBTAIN FIRST DATA TUPLES X AND SECOND DATA TUPLES Y; WHEREIN THE X TUPLES ARE DESCRIBING A POINT SEQUENCE ON THE SURFACE, THE CORRESPONDING COATING THICKNESS COVERAGE; WHEREIN THE Y TUPLES ARE DESCRIBING THE CORRESPONDING ROBOTIC PROGRAM

- 910 LEARNING FROM THE PROCESSED DATA A FUNCTION MAPPING THE X TUPLES INTO THE Y TUPLES TO GENERATE A COATING PREDICTION MODULE FOR THE ROBOT

- 912 FOR A GIVEN POINT SEQUENCE OF EACH GIVEN SURFACE ELEMENT, PROCEEDING, STARTING WITH A GIVEN SELECTED VALID THICKNESS COVERAGE AS INPUT PARAMETERS, IN AN ITERATIVE MANNER TO:
  - PREDICT A ROBOTIC PROGRAM VIA THE COATING PREDICTION MODULE;
  - SIMULATE THE PREDICTED ROBOTIC PROGRAM WITH A COLLISION DETECTION ENGINE WITHIN THE INDUSTRIAL SUB-CELL;
  - CALCULATE THE THICKNESS VALUES OF THE COATING MATERIAL ON THE GIVEN SURFACE ELEMENT BY DETECTED COLLISIONS BETWEEN ELEMENTS OF THE COATING DISPERSION OBJECT MOUNTED ON THE USED ROBOTIC COATING GUN AND SUB-ELEMENTS OF THE GIVEN SURFACE ELEMENT;
  WHERE THE INPUT PARAMETERS ARE ITERATIVELY TUNED UNTIL THE CALCULATED THICKNESS VALUES CORRESPOND TO THE SET OF DESIRED VALUE RANGE AND THERE ARE NO UNALLOWED ROBOTIC COLLISIONS WITHIN THE INDUSTRIAL SUB-CELL;

- 914 GENERATING A COATING ROBOTIC PROGRAM FOR EACH SURFACE ELEMENT BASED ON ONE OR MORE OF THE RESULTING TUNED ROBOTIC PROGRAMS

METHOD AND SYSTEM FOR GENERATING A ROBOTIC PROGRAM FOR INDUSTRIAL COATING

CROSS-REFERENCE TO RELATED APPLICATION

This application claims the priority, under 35 U.S.C. § 119, of German application EP 19180630, filed Jun. 17, 2019; the prior application is herewith incorporated by reference in its entirety.

BACKGROUND OF THE INVENTION

Field of the Invention

The present disclosure is directed, in general, to computer-aided design, visualization, and manufacturing ("CAD") systems, product lifecycle management ("PLM") systems, product data management ("PDM") systems, and similar systems, that manage data for products and other items (collectively, "Product Data Management" systems or PDM systems). More specifically, the disclosure is directed to production environment simulation.

The process of applying coating materials on surfaces of objects is a common operation in a large variety of industrial processes.

As used in the art, the term "coating" may denote either the verb, i.e. the operation of applying coating material, e.g. by spraying, or the noun, i.e. the coating material itself. In the industrial domain, a "coating material", or simply a "coating", is a layer of a substance applied over an object surface, for example for protection, functional and/or decoration purposes.

In addition, coating materials applied to base materials may be used to provide properties not inherent in the base, including corrosion, wear-resistance, conductivity, color, solderability and others.

Examples of coating materials are paints, lacquers, metal platings, thermal-barrier coating materials, anti-corrosion coating materials and other types of protective, functional or decorative coating materials.

As used herein, the term coating may also denote additive manufacturing where a three-dimensional ("3D") industrial object is built by adding layer-upon-layer of material, e.g. the coating material.

The amount of coating applied on a product object surface, that is, the coating thickness, often contributes to the product quality standard.

In fact, for quality, security, environmental, marketing and cost efficiency purposes, a coating operation is required to meet certain levels in terms of the achieved thicknesses and uniformity levels of the coating layer.

In several industrial processes, coating operations are mostly performed by coating guns which are mounted on robots.

Programming robots for coating activities in industrial cells is an exhausting, iterative, error prone and time-consuming task.

Improved techniques are desirable.

BRIEF SUMMARY OF THE INVENTION

Various disclosed embodiments include methods, systems, and computer readable mediums for generating a robotic program for industrial coating wherein the coating material is to be applied on a surface of an industrial object by a coating gun of a robot. The method includes receiving inputs including virtual representation of a robot, virtual representation of a robotic coating gun, virtual representation of a set of elements of the object surface to be coated and a set of desired coating thickness ranges, virtual representation of an industrial sub-cell. The method includes receiving inputs on a coating dispersion object to be mounted on the coating gun for emulating coating behavior of the coating gun. The method further includes receiving training data of a plurality of robotic programs for industrial coating and their corresponding coating thickness coverage on a plurality of surfaces. The method further includes processing the training data for machine learning purposes to obtain first data tuples x and second data tuples y; wherein the x tuples are describing a point sequence on the surface, the corresponding coating thickness coverage and specific information on the robot and on the surface; wherein the y tuples are describing the corresponding robotic program. The method further includes learning from the processed data a function mapping the x tuples into the y tuples to generate a coating prediction module for the robot. The method further includes, for a given point sequence of each given surface element, proceeding, starting with a given selected valid thickness coverage as input parameters, in an iterative manner to:
a) predict a robotic program via the coating prediction module;
b) simulate the predicted robotic program with a collision detection engine within the industrial sub-cell;
c) calculate the thickness values of the coating material on the given surface element by detected collisions between elements of the coating dispersion object mounted on the used robotic coating gun and sub-elements of the given surface element; and
d) where the input parameters are iteratively tuned until the calculated thickness values correspond to the set of desired value range and there are no unallowed robotic collisions within the industrial sub-cell. The method further includes generating a coating robotic program for each surface element based on one or more resulting tuned robotic programs.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the detailed description below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

Other features which are considered as characteristic for the invention are set forth in the appended claims.

Although the invention is illustrated and described herein as embodied in a method and a system for generating a robotic program for industrial coating, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 9 is a flowchart for generating a robotic program for industrial coating in accordance with disclosed embodiments.

DETAILED DESCRIPTION OF THE INVENTION

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Previous techniques for generating a robot program for industrial coating have some drawbacks. The embodiments disclosed herein provide numerous technical benefits, included but not limited to the following examples.

Embodiments enable automatic generation of a collision-free coating robotic program with the desired coating thickness coverage.

Embodiments enable reaching a faster, accurate and reliable solution to the coating industry quality requirements with reduced complexity, costs and efforts.

Figure 1:
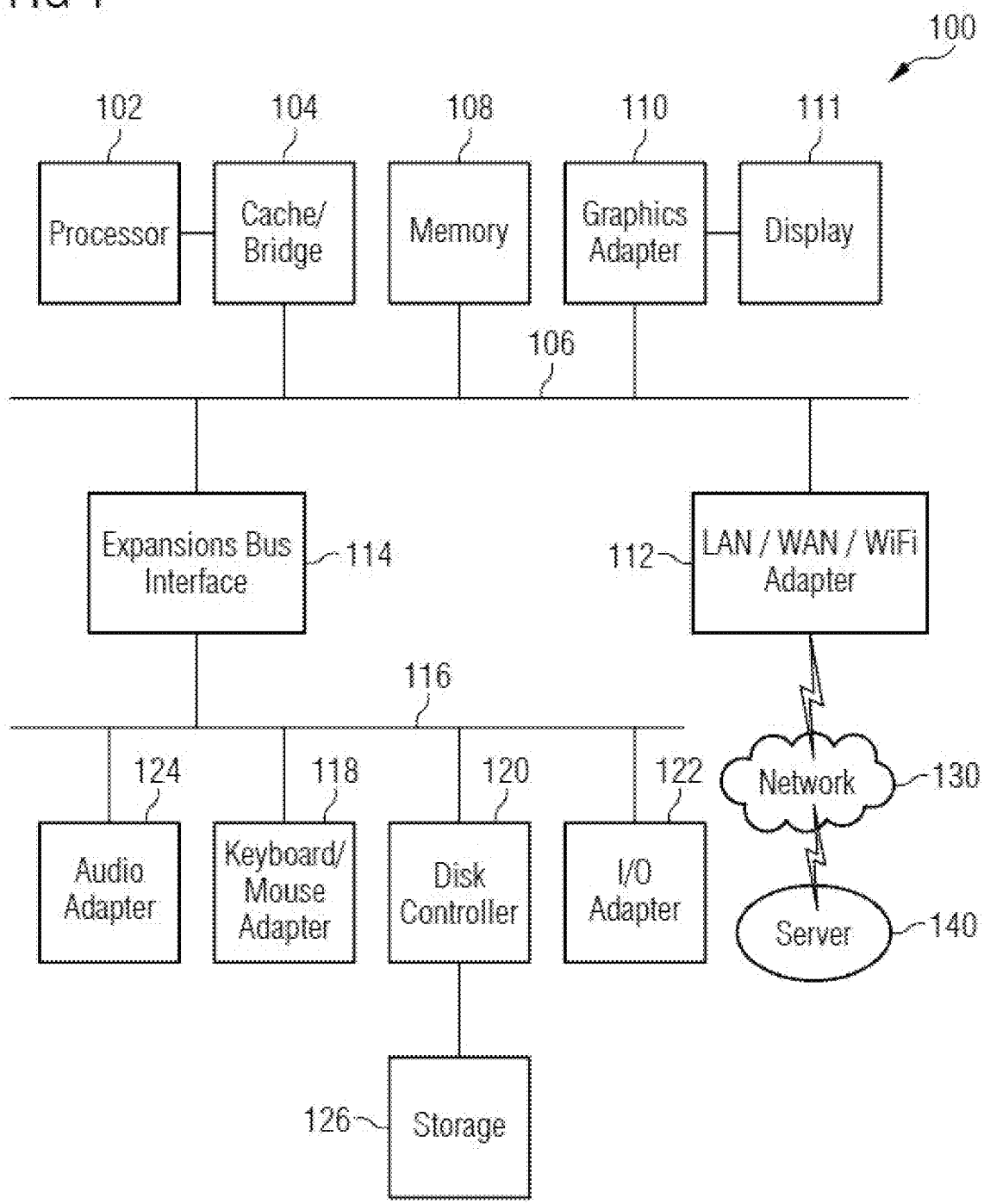
FIG. 1 is a block diagram of a data processing system in which an embodiment can be implemented.

Referring now to the figures of the drawings in detail and first, particularly to FIG. 1 thereof, there is shown a block diagram of a data processing system 100 in which an embodiment can be implemented, for example as a PDM system particularly configured by software or otherwise to perform the processes as described herein, and in particular as each one of a plurality of interconnected and communicating systems as described herein. The data processing system 100 illustrated can include a processor 102 connected to a level two cache/bridge 104, which is connected in turn to a local system bus 106. The local system bus 106 may be, for example, a peripheral component interconnect (PCI) architecture bus. Also connected to the local system bus in the illustrated example are a main memory 108 and a graphics adapter 110. The graphics adapter 110 may be connected to a display 111.

Other peripherals, such as local area network (LAN)/Wide Area Network/Wireless (e.g. WiFi) adapter 112, may also be connected to local system bus 106. An expansion bus interface 114 connects the local system bus 106 to the input/output (I/O) bus 116. The I/O bus 116 is connected to a keyboard/mouse adapter 118, a disk controller 120, and an I/O adapter 122. The disk controller 120 can be connected to a storage 126, which can be any suitable machine usable or machine readable storage medium, including but are not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to the I/O bus 116 in the example shown is an audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of the data processing system 100), which can be any public or private data processing system network or combination of networks, as known to those of skill in the art, including the Internet. The data processing system 100 can communicate over the network 130 with the server system 140, which is also not part of the data processing system 100, but can be implemented, for example, as a separate data processing system 100.

Figure 2:
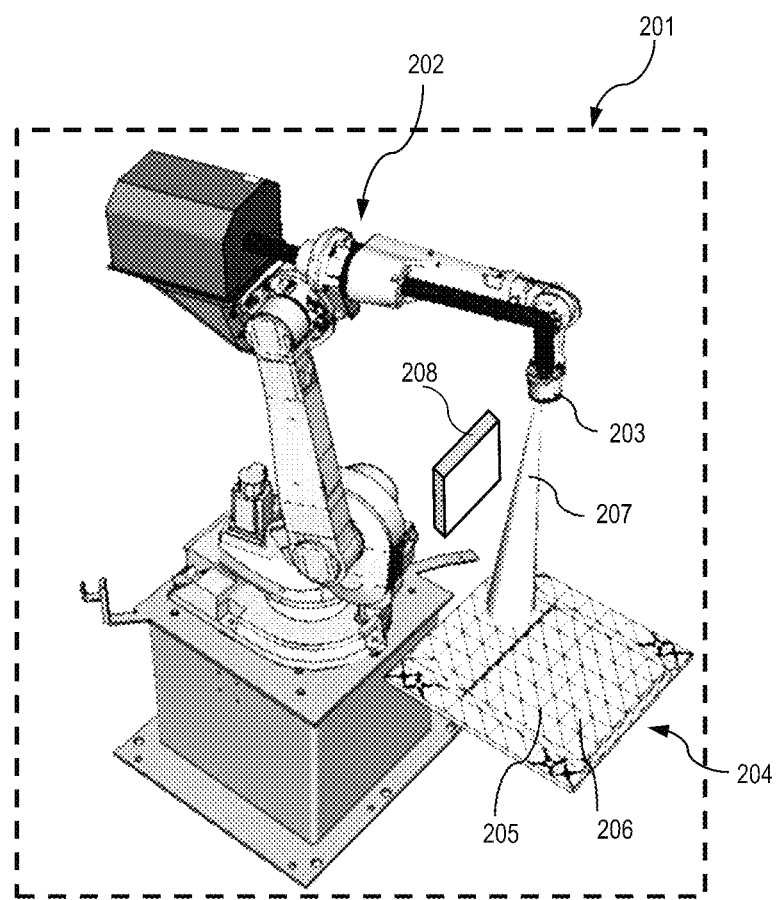
FIG. 2 is a perspective view of an industrial robot with a coating dispersion object mounted on its coating gun nozzle for generating a coating robotic program in accordance with disclosed embodiments.

FIG. 2 illustrates a schematic view of an industrial robot with a coating dispersion object mounted on its coating gun nozzle for generating a coating robotic program in accordance with disclosed embodiments.

In FIG. 2 it is shown a virtual representation of an industrial sub-cell 201 and a virtual representation of an industrial robot 202 with a coating gun 203 applying coating material on a surface 204 of an industrial object.

With the term "industrial sub-cell" we indicate an industrial cell or any portion of the industrial cell or any 3D environment around the robot 202 which may also include possible obstacles and/or forbidden volumes for detecting unallowed collisions with the robot. In the embodiment example of FIG. 2 an obstacle 208 is shown, a collision between the robot 202 and the obstacle 208 is herein denoted as "unallowed" collision. It is noted that the terminology "unallowed" collision is herein used for clarifications purposes to distinguish such type of collision from the other types of collisions to be detected by a collision detection engine for coating calculation purposes as discussed in detail in a subsequent section. The "coating" collisions are detected between 3D elements (not shown) of a coating dispersion object 207 and elements 205, 206 of the object surface 204.

Herein, a robotic program is considered to be collision-free when there are no "unallowed" collisions between the robot 202 and any potential obstacles 208. The 3D coating dispersion object 207 is composed of a plurality of 3D entities (not shown) each one having an associated coating dispersion value for calculating the applied coating thickness via the collision detection engine as discussed in detail in a subsequent section.

As shown in FIG. 2, coating material is applied by a coating gun 203 on the object surface 204. In embodiments, one or more relevant surface areas to be coated are selected, and a mesh representation is generated for the selected surface areas. A polygon mesh contains a collection of vertices 205, edges, and surface sub-elements 206 (e.g. usually triangles) defining the shape of a polyhedral object in 3D computer graphics. The resulting mesh geometry is like the geometry of the surface of the original object, and the mesh geometry contains several mesh sub-elements herein also called mesh-points. As a result, each sub-element of the mesh is a representation of a sub-element on the part/object surface. Those skilled in the art will understand that the density of the mesh points depends on the desired level of accuracy and the surface shape. The mesh density may also depend on the used spraying techniques; for example, laser paint spraying may require higher mesh element density than, for example, traditional non-laser paint gun spraying techniques.

The coating dispersion object 207 is mounted on the coating gun 203 for emulating coating behavior of the coating gun 203.

The coating dispersion object 207, with its plurality of 3D entities, represents the coating behavior of a given gun and/or of a given brush for the same given gun for a given coating material having certain physical properties, e.g. certain density and certain specific gravity.

It is noted that the given coat dispersion object 207 enables calculating the coating thickness applied on a surface while considering different mutual positions (e.g. different distances and/or angles within certain ranges) between the coating gun and the object surface. However, as the skilled in the art appreciates, for certain variability ranges of the angle, in order to achieve a higher calculation accuracy, it may be preferable to have a set of different coating dispersion objects corresponding to a different set of applied angles between the gun and the object surface.

Figure 3:
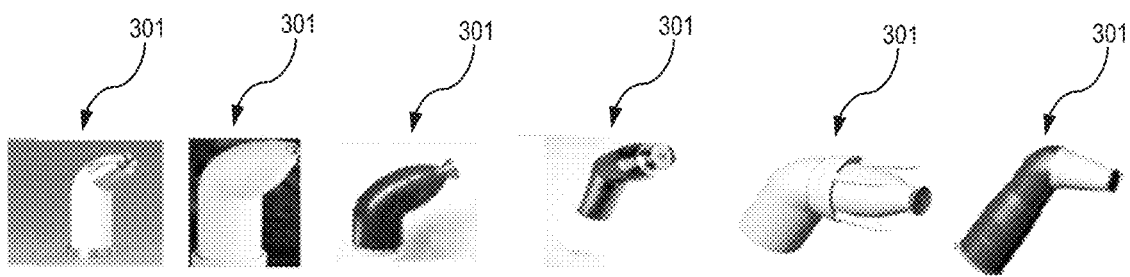
FIG. 3 is a perspective view of possible different examples of coating guns to be mounted on a robotic head.

FIG. 3 illustrates possible different examples of coating guns 301 to be mounted on a robotic head. Each coating gun 301 has at least one corresponding coating dispersion object (not shown) for a given coating material type. Each coating gun may have several different coating dispersion objects when several brushes are used and when several applied angles above a certain threshold are to be considered.

Figure 4:
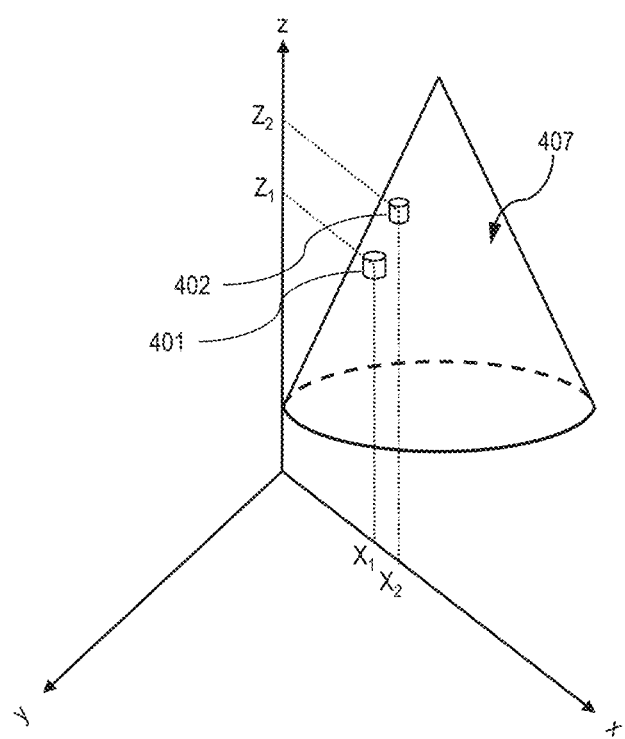
FIG. 4 is a schematic view of a coating dispersion object 407 in accordance with disclosed embodiments.

The coating dispersion object received as input for coating calculation purposes may be generated with numerous different techniques, including but not limited to the following examples: coating dispersion objects may be generated departing from a collection of measured real thickness footprints of coating material applied on real test surfaces by given coating guns and/or brushes as disclosed in U.S. patent application Ser. No. 14/809,343, wherein:

a) the coating dispersion objects may be generated with physical models for exact calculation of the applied coating thickness in industrial processes;

b) the coating dispersion objects may be generated with heuristic functions and/or with interpolations techniques;

c) in embodiments, the coating dispersion objects may be generated with machine learning;

d) techniques as illustrated with the example embodiment of FIG. 4. In embodiments, the coating dispersion objects may be generated with any combination of the above examples.

FIG. 4 illustrates a schematic view of a coating dispersion object 407 in accordance with disclosed embodiments. The coating dispersion object 407 is composed by a plurality of 3D entities each one with a corresponding coating dispersion value for coating calculation purposes. In FIG. 4 two 3D entities 401, 402 are shown with their corresponding (X,Y,Z) coordinates.

In embodiments, the coating dispersion object 407 may be generated via a function trained by a machine learning ("ML") algorithm. The training data are organized in input and output data where the output training data is related to the input training data. In embodiments, the input training data includes robotic gun information (e.g. type of coating gun, type of brush, index, angle and/or index of the coating dispersion object when supporting several different coating dispersion objects in a single ML module) and physical property information of the coating material and the output training data includes (X,Y,Z) coordinates of the 3D entities 401, 402 of the coating dispersion object 407 and their corresponding coating dispersion values (not shown).

With the above described input and output training data, a corresponding function for generating the coating dispersion object may conveniently be trained.

Thereafter, the model of the coating dispersion object is generated as output by applying the trained function to input data for example including information received on the robotic gun and on the coating material desired.

Figure 5:
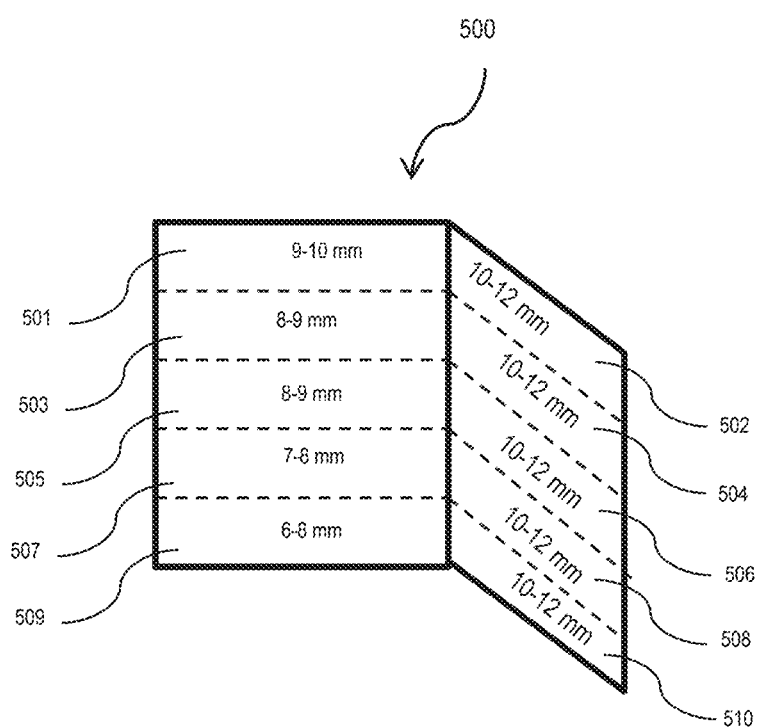
FIG. 5 is a schematic view of a part surface with surface elements 501-510 and corresponding desired coating thickness ranges in accordance with a disclosed embodiment.

FIG. 5 illustrates a schematic view of a part surface with surface elements 501-510 and corresponding desired coating thickness ranges in accordance with a disclosed embodiment.

In FIG. 5 there is shown a representation of a surface 500 of an industrial object, for example a part of a car over which coating is to be applied for example by spraying.

A mesh of the surface 500 is created by selecting relevant surface elements 501-510 and by creating a mesh (not shown) for each surface element. The mesh geometry is similar to the surface element geometry and is composed of a plurality of mesh elements (e.g. point, edge, vertexes and faces), often called mesh points. As a result, each point of the mesh represents a point on the corresponding part surface element 502 and it is herein denoted as point or sub-element of the surface element.

In FIG. 5 are shown examples of values of desired coating thickness ranges given in mm for each surface element 501-510. For example, for surface element 501 a desired coating thickness range of 9-10 mm is given. In embodiments, upon user selection, the given range of 9-10 mm for the element 501 may have different meanings and corresponding requirements. According to a first requirement, the desired coating thickness may be required to be constant so that any constant value between 9 and 10 mm is considered a valid coverage thickness range.

According to a second requirement, the desired thickness may be any variable value between 9 and 10 mm so that for example a thickness coverage with some sub-areas with a thickness of 9.1 mm and other sub-areas with a thickness of 9.5 mm is to be considered valid coverage.

In some requirements, a delta value may be given to specify what is the acceptable maximum value difference between points of the same surface element 501 or across different surface elements 501-510. For example, if a selected maximum delta value of 1 mm for elements 501, 502 is given, it is acceptable to have points with thickness 9 mm and other points with thickness 10 mm but it is not valid to have points with thickness 9 mm in the first element 501 and points with thickness 11 mm in the second element 501.

In embodiments, the thickness the coating material applied to the surface 204, 500 is calculated via simulation with a collision detection engine.

In the 3D virtual environment, the collision set to be detected for thickness calculation purposes is being defined between the following two groups of entities: the mesh points of the part surface 204 and the 3D entities of the coating dispersion objects 401, 402.

A robotic program of the coating path operation is simulated via a 3D virtual environment software.

The robotic motion planning module for the simulation may be for example based on one of the following modules:
a) Realistic Controller Simulation ("RCS") modules based on Realistic Robot Simulation ("RRS") interfaces typically provided by robot vendors;
b) Virtual Robot Controller ("VRC") applications of robot vendors;
c) an internal programmed motion planning engine like for example the MOP module in Process Simulate of Siemens Tecnomatix suite; and
d) a motion planning module obtained via machine learning training as disclosed in US patent application with application Ser. No. 16/196,156.

During the simulation, the coating dispersion object 207 is mounted on top of the robot's coating gun 203 for coating calculation purposes so that while the robot is moving it collides with certain mesh points of the part surface 204. For each given time interval, the dynamic collision detection engine reports which collision pairs are detected (mesh point vs. 3D object entity). For each reported collision pair, at runtime, the thickness value is then calculated with the coating dispersion value of the 3D object entity involved in the robot collision. The calculated thickness is then added to the collided mesh point thickness. Along the simulation, each mesh point holds its total thickness value so that also the spraying exposure time of the spraying gun is taken into account. This can for example be represented by thickness color maps, numerical representations or any other desired representation technique.

It is noted that during simulation of the robot motion, the collision detection engine reports also if there are un-allowed collision with obstacles or forbidden volumes (e.g. other pieces of equipment, humans or forbidden zones) in the industrial sub-cell to obtain as result a generated robotic program which is collision free.

Example Embodiment: Exemplary Structure of Input/Output Data for a Machine Learning Module In embodiments, the training data may synthetically be generated for a plurality of scenarios. For example, several different types of parts to be sprayed may be used. For each part, a plurality of robotic programs is generated. A plurality of coating dispersion objects may be used as models depending also on the plurality of coating guns/brushes and angles which are used. The coating gun, and the coating dispersion object are picked and mounted on the robot. Each robot program is simulated, and the corresponding coating thickness coverage is calculated with the collision detection engine.

The training data is processed to obtain input and output data for machine learning purposes.

For example, in embodiments, for each simulated robotic program, the following information is extracted and organized in input data tuples x and output data tuples y for machine learning purposes:
Input data tuple x contains:
List of ordered points upon the part surface.
For each point, (X,Y,Z) coordinates and coating thickness value.
Robot-part mutual information, e.g. delta between the robot base and the part position, delta between robot tool frame and the robot Tool
Center Point Frame ("TCPF") and other relevant information.
Output data tuple y contains:
robotic programs corresponding to the tuple x.
In embodiments, the robotic program of the tuple y may be given as list of list of robotic locations (with X,Y,Z, RX, RY, RZ coordinates) and whereby, for each location, also the corresponding robotic motion instructions may preferably be given (e.g. speed, acceleration, configuration, etc.). In the example embodiment of FIG. 7, three robotic locations 720, 730, 740 are shown for a robotic path during coating of a surface segment consisting of the two surface elements 701, 702.

A coating prediction module is generated by a function trained by a machine learning algorithm with the processed training data by learning a function mapping the x tuples into the y tuple. The machine learning module is trained to get "tuple x" as an input and to retrieve back "tuple y" as an output.

The type of this problem is called regression problem and in embodiments it is solved by using supervised learning algorithms. Supervised learning algorithms try to model relationships and dependencies between the target prediction output and the input features such that it is possible to predict the output values for new data based on those relationships learnt from the training data sets.

Numerical Example Embodiment

Figure 6:
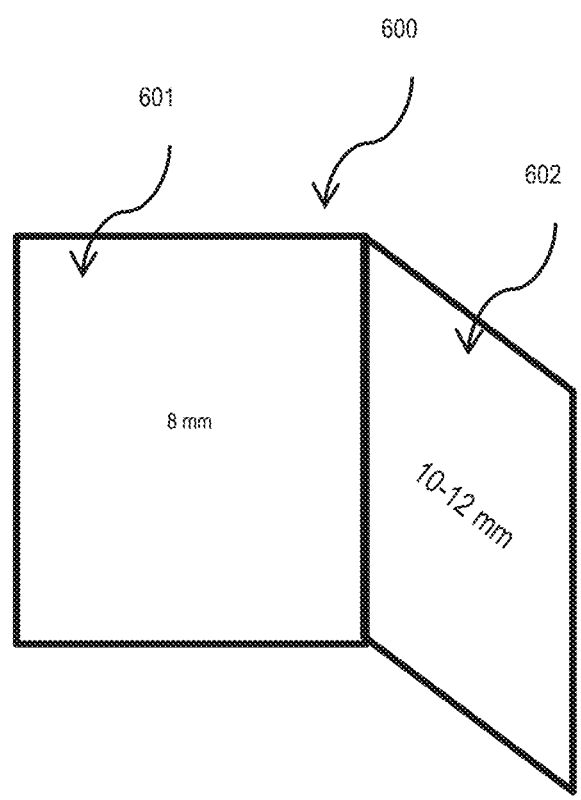
FIG. 6 illustrates a schematic view of a part surface 600 with surface elements and corresponding desired coating thickness ranges in accordance with another disclosed embodiment.

FIG. 6 illustrates a schematic view of a part surface 600 with surface elements 601, 602 and corresponding desired coating thickness ranges in accordance with another disclosed embodiment.

In FIG. 6, surface 600 has desired coating thickness ranges of 8 mm on the left surface element 601 and 10-12 mm on the right surface element 602. Assume that the allowed delta for the whole surface 600 is selected to be 1.5 mm for this example embodiment.

Figure 7:
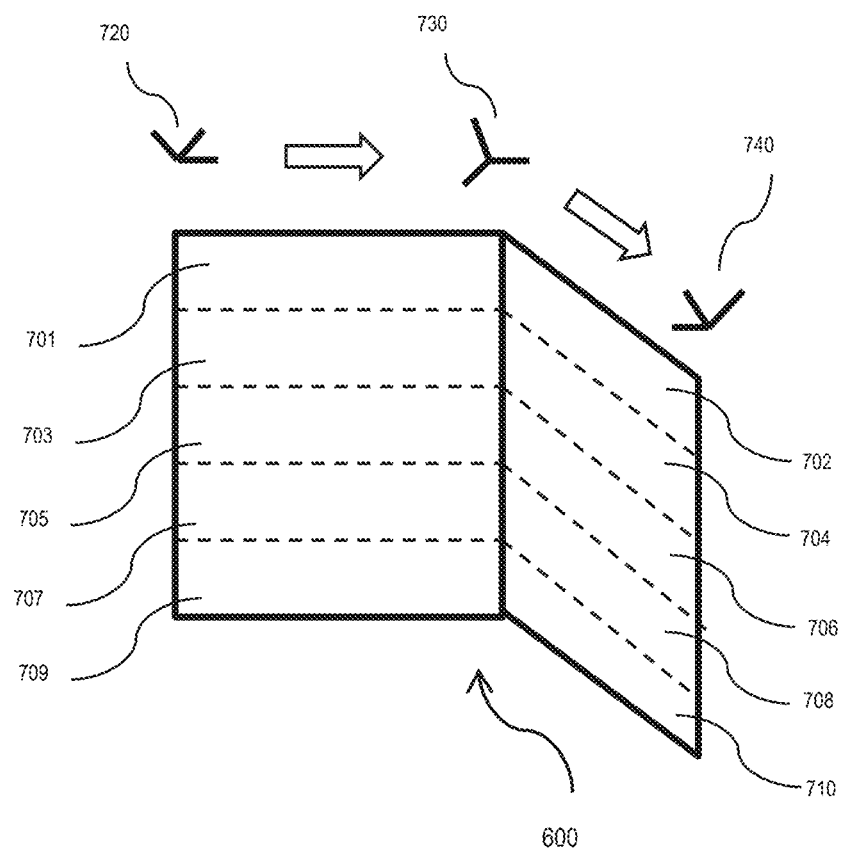
FIG. 7 is a schematic view of a part surface from FIG. 6 where ten surface elements have been considered for generating a coating robotic program according to the disclosed embodiments.

FIG. 7 illustrates a schematic view of the part surface of FIG. 6 where ten surface elements 701-710 have been considered for generating a coating robotic program according to disclosed embodiments.

In FIG. 7, the robot moves along robotic locations 720, 730 and 740 to spray a first surface segment formed of the two upper surface elements 701, 702. In this example, the surface 600 consists of five segments, whereby a segment consists of two adjacent surface elements 701-702, 703-704, . . . , 709-710 which are coated in one robotic path consisting of three consequent robotic locations 720, 730 and 740.

In embodiments, algorithm steps include:

1) picking a coating gun and mounting it on the robot together with the corresponding coating dispersion object;

2) calculating delta between the robot base and the part position and delta between robot tool frame and the robot TCPF;

3) creating tuple x for a segment 701-702, 703-704, . . . , 709-710:
creating a sequence of points (not shown) along the segment;
collecting the point sequence coordinates;

4) picking for each point a valid coating thickness value, i.e. valid under the range and delta constraints;

5) inserting the created tuple x data into the trained function module and getting back a "tuple y" data results, the predicted robotic program given in terms of robotic locations 720, 730, 740 and corresponding robotic motion instructions;

6) simulating the predicted robotic program and calculating the thickness coverage;

7) if the thicknesses results are in a valid range (See FIG. 9A) and if there is no forbidden collision, a robotic program based on the predicted robotic program is generated for this segment and go to step 3) by selecting the subsequent segment or done if all five segments are finished; and 8) If the thicknesses results are not in a valid range (see FIGS. 9B, 9C) or if there is a forbidden collision, go to step 4 by selecting different valid coating thickness values range.

FIGS. 8A-8C illustrate schematic views showing valid and non-valid thickness coverages on surfaces according to disclosed embodiments.

Figure 8:
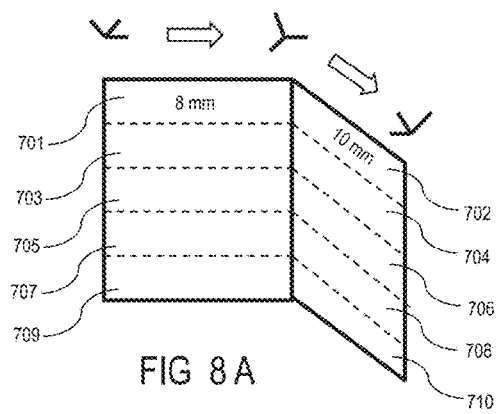
FIG. 8A-C are schematic views showing valid and nonvalid thickness coverages on surfaces according to the disclosed embodiments.
Figure 8:
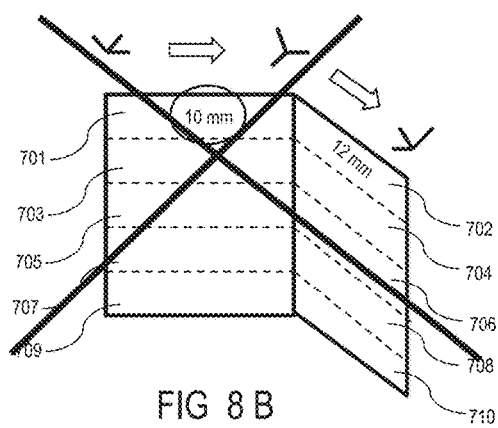
Figure 8:
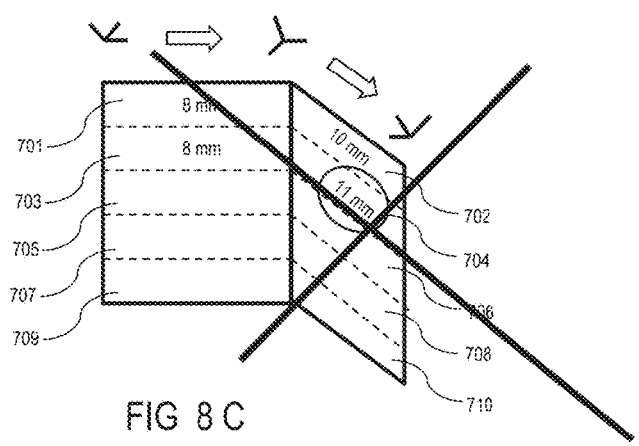

In FIG. 8A, the simulated coating thickness results are in a valid range while in FIGS. 8B and 8C the simulated coating thickness results are not in a valid range. In particular, for FIG. 8 B the thickness value of 10 mm for surface element 701 is outside the desired coverage of 8 mm with a delta of 1.5 mm and for FIG. 8 C the thickness value of 11 mm has a delta above 1.5 mm with respect of the 8 mm of the adjacent surface element.

Another Example Embodiment of Algorithm Steps

A robotic program for industrial coating is generated, for an industrial process where coating material is to be applied on a surface of an industrial object by a coating gun of a robot. The algorithm steps include:

a) receiving inputs including virtual representation of a robot, virtual representation of a robotic coating gun, virtual representation of a set of elements of the object surface to be coated and a set of desired coating thickness ranges, virtual representation of an industrial sub-cell;

b) receiving inputs on a coating dispersion object to be mounted on the coating gun for emulating coating behavior of the coating gun;

c) receiving training data of a plurality of robotic programs for industrial coating and of their corresponding coating thickness coverage on a plurality of surfaces;

d) processing the training data for machine learning purposes to obtain first data tuples x and second data tuples y; wherein the x tuples are describing a point sequence on the surface, the corresponding coating thickness coverage and specific information on the robot and on the surface; wherein the y tuples are describing the corresponding robotic program;

e) learning from the processed data a function mapping the x tuples into the y tuples to generate a coating prediction module for the robot;

f) for a given point sequence on a given surface element, with a given selected valid thickness coverage, predicting the corresponding robotic program via the coating prediction module;

g) simulating with a collision detection engine the robot's motion within the industrial sub-cell with the predicted robotic program;

h) calculating the thickness values of the coating material on the given surface element by detected collisions between elements of the coating dispersion object mounted on the used robotic coating gun and sub-elements of the given surface element;

i) if the calculated thickness values correspond to the set of desired value range and if there are no unallowed robotic collisions within the industrial sub-cell, go to sub-step I2) otherwise perform a tuned iteration by going to sub-step i1);

i1) tuning the robot's motion by selecting a different given valid thickness coverage for the given point sequence and repeating step F) until I) until end of iterations; and i2) generating the coating robotic program for the given surface element based on the predicted robotic program; and if there are other surface elements to be coated, selecting another given surface element and repeating step F) until I).

In embodiments, at least one of the tuned iterations include selecting a different coating gun, brush and/or coating angle between the object surface and the coating gun. Accordingly, a different corresponding coating dispersion object is then used during the simulation. Advantageously, the skilled in the art easily appreciates that the output of the coating prediction module depends on the coating dispersion object used for the input training data during the training of the ML module. In embodiments, several dispersion objects can be used. According to embodiments, it is possible to use a single ML module by inserting the dispersion object index as part of the tuple x so that the index is part of the input data tuple x. According to other embodiments, several ML modules are used one for each coating dispersion object and for prediction purposes the relevant ML module is used each time.

In embodiments, the data describing the robotic locations comprise at least information on the positions of the location (e.g. poses, positions and/or directions of the location) and, optionally, it may additionally comprise information on the robotic motion at the location (e.g. speed, acceleration, tension, state and/or other robotic motion related information at the location).

In embodiments, the output data tuple y contains the minimum information required for describing the robotic program of the specific robot.

In embodiments, the information describing the location position may be given in the form of spatial coordinates describing the robot's tip position independently on the robot type or it may be given as robot poses (e.g. via robot's joint values). In other embodiments, the location position information may be given in other formats that may or may not be robot specific.

In embodiments, position information of the robotic locations may conveniently be given as relative to a given reference frame of the specific robot. Preferably, the given reference frame of the specific robot may be the robot base frame.

In embodiments, the input data contains robotic tool-related information. For example, robot tool-related information may comprise robot's tool type and/or tool differential position information. The differential tool position information may preferably be the delta between the robot's tool frame and the robot's TCPF frame.

In embodiments, the object surface to be coated is the surface of a support material for additive manufacturing purposes.

FIG. 9 illustrates a flowchart 900 of a method for generating a robotic program for industrial coating in accordance with disclosed embodiments. Such method can be performed, for example, by system 100 of FIG. 1 described above, but the "system" in the process below can be any apparatus configured to perform a process as described.

At step 902, inputs are received including virtual representation of a robot, virtual representation of a robotic coating gun, virtual representation of a set of elements of the object surface to be coated and a set of desired coating thickness ranges, and virtual representation of an industrial sub-cell.

At step 904, inputs on a coating dispersion object to be mounted on the coating gun for emulating coating behavior of the coating gun are received.

At step 906, training data of a plurality of robotic programs for industrial coating and of their corresponding coating thickness coverage on a plurality of surfaces are received.

At step 908, the training data are processed for machine learning purposes to obtain first data tuples x and second data tuples y; wherein the x tuples are describing a point sequence on the surface, the corresponding coating thickness coverage and specific information on the robot and on the surface; wherein the y tuples are describing the corresponding robotic program.

At step 910, from the processed data, it is learnt a function mapping the x tuples into the y tuples to generate a coating prediction module for the robot.

At step 912, for a given point sequence of each given surface element, it is proceeded starting with a given selected valid thickness coverage as input parameters, in an iterative manner to:
  predict a robotic program via the coating prediction module;
  simulate the predicted robotic program with a collision detection engine within the industrial sub-cell;
  calculate the thickness values of the coating material on the given surface element by detected collisions between elements of the coating dispersion object mounted on the used robotic coating gun and sub-elements of the given surface element; where the input parameters are iteratively tuned until the calculated thickness values correspond to the set of desired value range and there are no unallowed robotic collisions within the industrial sub-cell.

At step 914, it is generated a coating robotic program for each surface element based on one or more predicted robotic programs resulting from step 912.

In embodiments, at least one of the tuned iterations include selecting a different coating gun, brush and/or angle and by selecting a different corresponding coating dispersion object.

In embodiments, inputs on a coating dispersion object generated via a machine learning algorithm are received.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims.

The invention claimed is:

1. A method for generating, via a data processing system, a robotic program for industrial coating, wherein a coating material is to be applied on a surface of an industrial object by a coating gun of a robot, which comprises the following steps of:
    a) receiving inputs including a virtual representation of the robot, a virtual representation of the coating gun, a virtual representation of a set of elements of the surface to be coated, a set of desired coating thickness ranges, and a virtual representation of an industrial sub-cell;
    b) receiving inputs on a coating dispersion object to be mounted on the coating gun for emulating coating behavior of the coating gun;
    c) receiving training data of a plurality of robotic programs for industrial coating and of their corresponding coating thickness coverage on a plurality of surfaces;
    d) processing the training data for machine learning purposes to obtain first data tuples x and second data tuples y, wherein x tuples are describing a point sequence on the surface, the corresponding coating thickness coverage and specific information on the robot and on the surface, wherein y tuples are describing a corresponding robotic program;
    e) learning from the training data processed, a function mapping the x tuples into the y tuples to generate a coating prediction module for the robot;
    f) for a given point sequence of each given surface element, proceeding, starting with a given selected valid thickness coverage as input parameters, in an iterative manner to:
        i) predict the robotic program via the coating prediction module;
        ii) simulate a predicted robotic program with a collision detection engine within the industrial sub-cell;
        iii) calculate thickness values of the coating material on the given surface element by detected collisions between elements of the coating dispersion object mounted on the coating gun and sub-elements of the given surface element;
    where the input parameters are iteratively tuned until calculated thickness values correspond to a set of desired value ranges and there are no unallowed robotic collisions within the industrial sub-cell; and
    g) generating a coating robotic program for each surface element based on at least one said predicted robotic program resulting from the step f).

2. The method according to claim 1, which comprises selecting during at least one iteration:
    a different coating gun;
    a different brush;
    a different angle; and
    a different corresponding coating dispersion object.

3. The method according to claim 1, which further comprises receiving inputs on the coating dispersion object generated via a machine learning algorithm.

4. A data processing system, comprising:
    a processor;
    an accessible memory connected to said processor;
    the data processing system configured to:
        a) receive inputs including virtual representation of a robot, virtual representation of a coating gun, virtual representation of a set of elements of an object surface to be coated, a set of desired coating thickness ranges, and virtual representation of an industrial sub-cell;
        b) receive inputs on a coating dispersion object to be mounted on the coating gun for emulating coating behavior of the coating gun;
        c) receive training data of a plurality of robotic programs for industrial coating and of their corresponding coating thickness coverage on a plurality of surfaces;
        d) process the training data for machine learning purposes to obtain first data tuples x and second data tuples y; wherein x tuples are describing a point sequence on the object surface, the corresponding coating thickness coverage and specific information on the robot and on the object surface; wherein y tuples are describing a corresponding robotic program;
        e) learn from the training data processed a function mapping the x tuples into the y tuples to generate a coating prediction module for the robot;
        f) for a given point sequence of each given surface element, proceed, starting with a given selected valid thickness coverage as input parameters, in an iterative manner to:
            i) predict a robotic program via the coating prediction module;
            ii) simulate a predicted robotic program with a collision detection engine within the industrial sub-cell;
            iii) calculate thickness values of a coating material on a given surface element by detected collisions between elements of the coating dispersion object mounted on the coating gun and sub-elements of the given surface element;
        where the input parameters are iteratively tuned until calculated thickness values correspond to a set of desired value ranges and there are no unallowed robotic collisions within the industrial sub-cell; and
        g) generate a coating robotic program for each surface element based on at least one resulting predicted robotic programs.

5. The data processing system according to claim 4, wherein the data processing system is configured to select during at least one iteration a different coating gun, brush and/or angle and to select a different corresponding coating dispersion object.

6. The data processing system according to claim 4, wherein the data processing system is configured to receive inputs on the coating dispersion object generated via a machine learning algorithm.

7. A non-transitory computer-readable medium encoded with executable computer instructions that, when executed, cause a data processing system to:
    a) receive inputs including virtual representation of a robot, virtual representation of a coating gun, virtual representation of a set of elements of an object surface to be coated, a set of desired coating thickness ranges, and virtual representation of an industrial sub-cell;

b) receive inputs on a coating dispersion object to be mounted on the coating gun for emulating coating behavior of the coating gun;
c) receive training data of a plurality of robotic programs for industrial coating and of their corresponding coating thickness coverage on a plurality of surfaces;
d) process the training data for machine learning purposes to obtain first data tuples x and second data tuples y; wherein x tuples are describing a point sequence on a surface, the corresponding coating thickness coverage and specific information on the robot and on the surface; wherein the y tuples are describing the corresponding robotic program;
e) learn from the training data processed a function mapping the x tuples into the y tuples to generate a coating prediction module for the robot;
f) for a given point sequence of each given surface element, proceed, starting with a given selected valid thickness coverage as input parameters, in an iterative manner to:
  i) predict a robotic program via the coating prediction module;
  ii) simulate a predicted robotic program with a collision detection engine within the industrial sub-cell;
  iii) calculate thickness values of the coating material on the given surface element by detected collisions between elements of the coating dispersion object mounted on the coating gun and sub-elements of the given surface element;
  where the input parameters are iteratively tuned until calculated thickness values correspond to a set of desired value ranges and there are no unallowed robotic collisions within the industrial sub-cell; and
g) generate a coating robotic program for each surface element based on at least one resulting predicted robotic programs.

8. The non-transitory computer-readable medium according to claim 7, wherein during at least one iteration a different coating gun, brush and/or angle are selected and a different corresponding coating dispersion object is selected.

9. The non-transitory computer-readable medium according to claim 7, wherein received inputs on the coating dispersion object are generated via a machine learning algorithm.

* * * * *